(12) United States Patent
Hatauchi et al.

(10) Patent No.: US 6,475,829 B2
(45) Date of Patent: Nov. 5, 2002

(54) SEMICONDUCTOR DEVICE AND MANUFACTURING METHOD THEREOF

(75) Inventors: Kazushi Hatauchi, Hyogo (JP); Haruo Shimamoto, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/929,046

(22) Filed: Aug. 15, 2001

(65) Prior Publication Data

US 2002/0135074 A1 Sep. 26, 2002

(30) Foreign Application Priority Data

Mar. 21, 2001 (JP) .......................................... 2001-080196

(51) Int. Cl.$^7$ .............................................. H01L 21/44
(52) U.S. Cl. ..................................... 438/108; 222/179.1
(58) Field of Search ......................... 257/778; 438/108; 222/179.1; 29/832

(56) References Cited

FOREIGN PATENT DOCUMENTS

| JP | 9-64078 | 3/1997 |
|---|---|---|
| JP | 11-307586 | 11/1999 |
| JP | 2000-150569 | 5/2000 |

*Primary Examiner*—Olik Chaudhuri
*Assistant Examiner*—Douglas A. Wille
(74) *Attorney, Agent, or Firm*—Leydig, Voit & Mayer, Ltd.

(57) ABSTRACT

A semiconductor device of the present invention includes a semiconductor chip with bumps on a surface, and an adhesion sheet on the surface of semiconductor chip. The adhesion sheet has a film base material layer and a film adhesion layer for adhering the film base material layer to the semiconductor chip, and a part of the sheet melts upon heating and tears in response to pressure applied during flip chip bonding. Therefore, it is possible to obtain a semiconductor device which enables good flip chip bonding without any gaps between a device and a substrate in a simple manufacturing process, and to manufacture the semiconductor device.

4 Claims, 5 Drawing Sheets

SEMICONDUCTOR DEVICE AND MANUFACTURING METHOD THEREOF

BACKGROUND OF THE INVENTION

1. Field of the Invention

The present invention relates to a semiconductor device with high reliability and productivity, wherein a device can be easily mounted on a substrate in a flip-chip mounting, and to a method of manufacturing the device.

2. Description of the Background Art

Flip-chip-mounting of a device is usually performed in the following manner.

FIG. 10 is a schematic sectional view showing how a device is mounted to a substrate by the ordinary flip chip technique. Referring to FIG. 10, an individual semiconductor device 101 is prepared with bumps 104 on its surface. Bumps 104 of this semiconductor device 101 are aligned with electrodes 106a of a printed substrate 106. Thereafter, semiconductor device 101 is mounted on printed substrate 106, and bumps 104 and electrodes 106a are electrically connected by reflow-melting of solder. The solder may be bump 104 itself, or may be the solder precoated on printed substrate 106.

Then, a liquid material referred to as an underfill material 109 is injected between semiconductor device 101 and printed substrate 106 by injection equipment 130. This underfill material 109 is injected for the purpose of, for example, decreasing microstress on bumps 104, protecting semiconductor device 101 from external humidity or shocks, and ensuring sufficient reliability.

However, since underfill material 109 fills the space between semiconductor device 101 and printed substrate 106 employing capillarity, it has the following problems: filling requires a long time; air can be caught up, generating voids 131 inside, depending on the bump pattern; filling of a large chip is impossible; sufficient physical properties, such as heat resistance, are not ensured; and the total mounting processes are complicated.

One of the techniques to solve these problems involved in the underfill material is disclosed, for example, in Japanese Patent Laying-Open No. 11-307586.

FIG. 11 is a schematic sectional view showing a structure of a semiconductor device of the flip chip mounting type disclosed in Japanese Patent Laying-Open No. 11- 307586. Referring to FIG. 11, this laid-open application discloses a structure in which a thermosetting resin layer 205 and a protection film 206 are provided on the surface of a semiconductor device 201 where bumps 204 are formed. Here, the thermosetting resin layer 205 has such a nature that it is liquid at a temperature for connecting bumps 204 upon flip chip mounting of this semiconductor device 201, and is pushed away from the connecting section of the bumps 204 by pressure used for mounting and enables the bumps 204 and electrodes of the printed substrate to be joined together.

The thermosetting resin layer 205 is applied to the bumps-forming-surface of the semiconductor device 201 and dried thereafter, or applied by coating, or by flow of a melted film- or sheet-shaped thermosetting resin under pressure.

However, in the semiconductor device of the flip chip mounting type disclosed in the above-mentioned laid-open application, steps of previously applying (coating) liquid thermosetting resin and solidifying the resin by drying or other means after the application are needed. In addition, in the case of a film- or sheet-shaped thermosetting resin, coating had to be performed in a melted state by means of pressurized flow, for example.

In addition, after a dicing process, since an individual semiconductor device has that surface on which bumps are provided (a surface on which a semiconductor integrated circuit is formed) facing upward (and a dicing sheet is adhered on a lower surface), the individual semiconductor device had to be picked up carefully to avoid contact with the bumps on its upper surface.

SUMMARY OF THE INVENTION

An object of the present invention is to provide a semiconductor device which enables good flip chip bonding without any gaps between a device and a substrate by a simple manufacturing process, and a method of manufacturing the semiconductor device.

Semiconductor device of the present invention includes a flip chip device with bumps formed on its surface and a sheet provided on the bumps-formed surface of the flip chip device. The sheet has a base material layer and a flip-chip-side adhesion layer for adherence of the base material layer to the flip chip device, and its structure is such that, a part of the sheet melts by heating and tears by pressuring during flip chip bonding.

According to the semiconductor device of the present invention, since the sheet melts by heating and tears by pressuring during flip chip bonding, bumps are exposed from the torn sheet. Then the exposed bumps can be electrically connected to electrodes on a surface of a substrate.

Such sheet is adhered on the bumps-formed surface of the flip chip device by an adhesion layer. Therefore, in contrast to the conventional example, steps of applying liquid thermosetting resin and solidifying thereafter by drying, e. g., are unnecessary. It is also unnecessary to coat with film- or sheet-shaped membrane in melted state by pressure flow, for example. Thus, the manufacturing steps can be simplified compared to that of conventional example.

In addition, the sheet torn at flip chip bonding is embedded between the flip chip device and the substrate after flip chip bonding, so it can eliminate the gaps therebetween.

Furthermore, since the bumps are covered with the sheet by adhering of the sheet prior to dicing process, the semiconductor device can be picked up without contacting with the bumps after dicing. This prevents sticking of foreign matters on surfaces of bumps and establishes good connectivity between bumps and electrodes of the mounted substrate.

Furthermore, high positional accuracy or high load is unnecessary upon adhering the sheet to the flip chip device, because the employed sheet has such a structure that a part of the sheet melts by heating and tears by pressuring during flip chip bonding.

In the semiconductor device described above, it is preferable that a substrate having electrodes on its surface is further provided. The bumps are exposed from the sheet surface when the sheet is torn, and the exposed bumps are electrically connected to electrodes on a surface of the substrate by flip chip bonding.

Thus, good connection between the bumps and the electrodes is established, and flip chip bonding can be carried out by simpler steps as compared to conventional example.

In the semiconductor device described above, it is preferable that the flip chip device bonded to the substrate by flip chip technique is sealed with an insulator.

Thus, the present invention can be applied, for example, to CSP (Chip Scale Package) or BGA (Ball Grid Array).

In the semiconductor device described above, it is preferable that the sheet is embedded between the flip chip device and the substrate without gaps.

This can enhance adhesion of the flip chip device and the substrate.

In the semiconductor device described above, it is preferable that the sheet has a substrate-side adhesion layer provided on a surface opposite to that surface on which a flip-chip-side adhesion layer of a base material layer is provided.

This can increase junctional strength of the flip chip device to the substrate.

Manufacturing method of the semiconductor device according to the present invention includes the following steps.

First, the sheet having a base material layer and an adhesion layer is adhered on the bumps-formed surface of the flip chip device with the adhesion layer to cover the bumps. Then the flip chip device with the sheet adhered is flip-chip-bonded to the substrate having electrodes by pressuring and heating. A part of the sheet melts by heating and the sheet tears by pressuring during this flip chip bonding, and bumps are exposed from the torn sheet. Then the bumps and the electrodes are electrically connected to each other.

According to the manufacturing method of the semiconductor device of the present invention, the sheet is adhered on the bumps-formed surface of the flip chip device by an adhesion layer. Therefore, in contrast to the conventional example, steps of applying liquid thermosetting resin and solidifying thereafter by drying, e. g., are unnecessary. It is also unnecessary to coat with film- or sheet-shaped membrane in melted state by pressure flow, for example. Thus, the manufacturing steps can be simplified compared to that of conventional example.

In addition, the sheet torn at flip chip bonding is embedded between the flip chip device and the substrate after flip chip bonding, so it can eliminate the gaps therebetween.

Furthermore, since the bumps are covered with the sheet by adhering of the sheet prior to dicing process, the semiconductor device can be picked up without contacting with the bumps after dicing. This prevents sticking of foreign matters on surfaces of bumps and establishes good connectivity between bumps and electrodes of the mounted substrate.

Furthermore, high positional accuracy or high load is unnecessary upon adhering the sheet to the flip chip device, because the sheet has such a structure that a part of the sheet melts by heating and tears by pressuring during flip chip bonding.

In the manufacturing method of the semiconductor device described above, it is preferable that the sheet is adhered to the flip chip device in a vacuum chamber under atmosphere of increased degree of vacuum.

This allows the sheet to adhere without gaps to the surface of the flip chip device when the sheet tears. It is therefore possible to embed without any gaps between the flip chip device and the substrate after flip chip bonding.

In the manufacturing method of the semiconductor device described above, it is preferable that the step of forming the flip chip device by dicing a semiconductor wafer is further included, wherein the sheet is adhered to the semiconductor wafer prior to the dicing of the semiconductor wafer.

This can simplify the manufacturing steps, because adhering the sheet to every semiconductor chip after dicing is unnecessary.

In the manufacturing method of the semiconductor device described above, it is preferable that the sheet is prepared integrated into the dicing sheet.

This eliminates either the step of adhering the sheet to the semiconductor wafer or the step of adhering the semiconductor wafer to the dicing sheet, and can further simplify the manufacturing steps.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Preferred embodiments of the present invention will be described below with reference to the drawings.

First Embodiment

Figure 1:
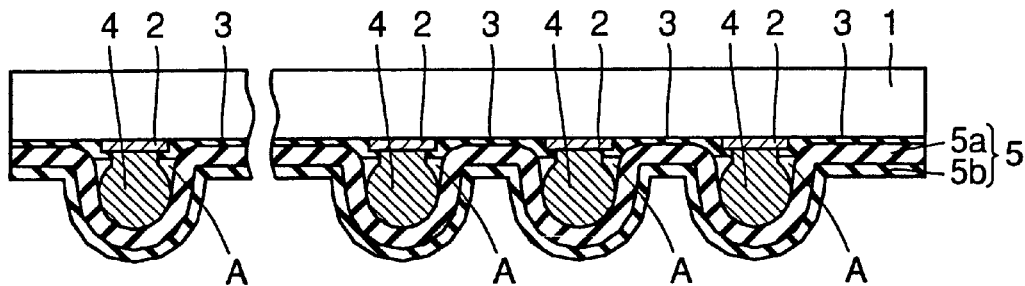
FIG. 1 is a schematic cross sectional view showing a structure of a semiconductor device in a first embodiment of the present invention.

Referring to FIG. 1, electrodes 2 are formed on the surface of semiconductor chip 1, and a surface protection film 3 is formed on that surface of semiconductor chip 1 where electrodes 2 are formed. Surface protection film 3 is made of a material including polyimide, for example. Bumps 4 consisting of solder, for example, are formed on electrodes 2 exposed from surface protection film 3.

On this bumps-formed surface of semiconductor chip 1, an adhesion sheet 5 is adhered so as to cover the surface of each bump 4. This adhesion sheet 5 has a stacked structure of a film base material layer 5b and a film adhesion layer 5a for adhering film base material layer 5b to semiconductor chip 1. This adhesion sheet 5 has such a structure that a part of the sheet melts by heating and tears by pressuring during flip chip bonding. Film base material layer 5b is made of resin such as epoxy-based resin (rubber deformative epoxy resin), and more particularly, it is made of HS222 manufactured by Hitachi Chemical Co., Ltd. In addition, thickness of adhesion sheet 5 is set to be, e. g., about 40 μm.

It is to be noted that, while there are gaps A between adhesion sheet 5 and the surface of semiconductor chip 1, these gaps A are in nearly vacuum state as will be described below.

Flip chip bonding using semiconductor device of this embodiment will be described.

Referring to FIG. 1, on the bumps-formed surface of semiconductor wafer 1 before dicing, adhesion sheet 5 is adhered so as to cover the surface of each bump 4. It is preferable that this adhering of adhesion sheet 5 takes place in a vacuum chamber under atmosphere of increased degree of vacuum. Since adhesion sheet 5 is adhered in a vacuum chamber, gaps A between semiconductor wafer 1 and adhesion sheet 5 are in nearly vacuum state.

Then, semiconductor wafer 1 is diced and separated to an individual semiconductor chip 1. Adhesion sheet 5 is also diced concurrently.

Figure 2:
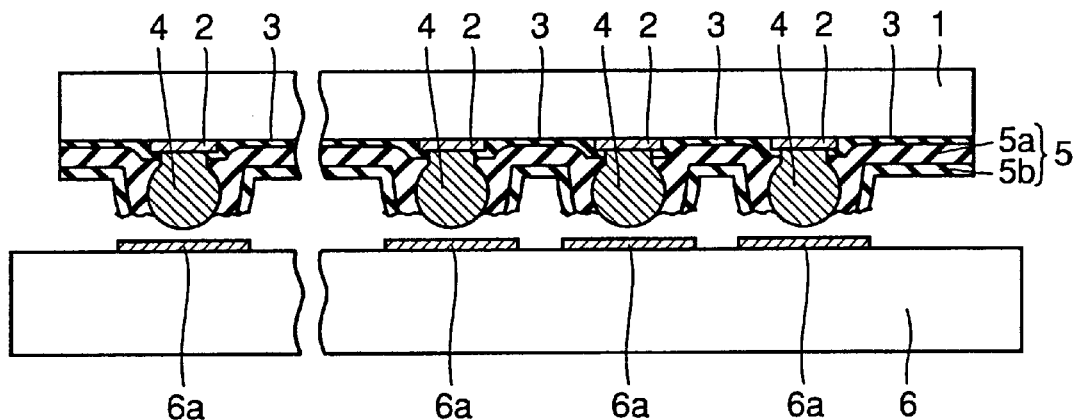
FIGS. 2 and 3 are schematic cross sectional views showing steps of method of manufacturing a semiconductor device (flip chip bonding method) in the first embodiment of the present invention.

Referring to FIG. 2, the semiconductor chip 1 with adhesion sheet 5 adhered thereon is flip-chip-bonded to an organic substrate 6, on which surface electrodes 6a are formed. This flip chip bonding is carried out by pressuring semiconductor chip 1 against organic substrate 6 with a load of 0.147–0.196 N/bump×5 sec., for example, while a jig which supports organic substrate 6 is heated to, e. g., 250° C.

During the flip chip bonding, parts of adhesion sheet 5 which are covering surfaces of bumps 4 come into contact with electrodes 6a firstly. Since organic substrate 6 is heated by the jig, the parts of adhesion sheet 5 in contact with electrodes 6a of organic substrate 6 melts with the heat, and the thickness of that parts of adhesion sheet 5 becomes thinner. Then adhesion sheet 5 tears with said load provided for bonding, and surfaces of bumps 4 are partially exposed from the torn part.

As described according to FIG. 1, gaps A between adhesion sheet 5 and semiconductor chip 1 are in nearly vacuum state so that, during said tearing, adhesion sheet 5 and bumps-formed surface of semiconductor chip 1 are joined together so as to eliminate gaps. Therefore, gaps between adhesion sheet 5 and a surface of semiconductor chip 1 are eliminated.

Figure 3:
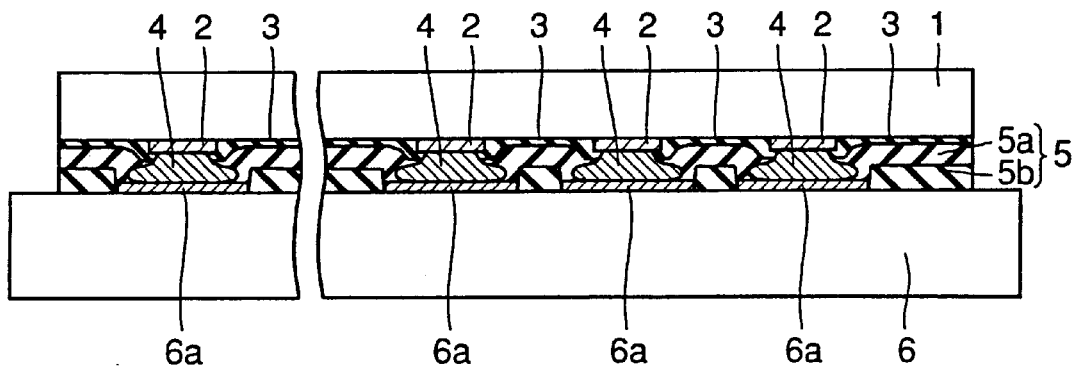

Referring to FIG. 3, bumps 4 are melted or deformed by further pressuring, and electrodes 6a of organic substrate 6 and bumps 4 can be electrically connected to each other, while flip chip bonding without gaps between semiconductor chip 1 and organic substrate 6 is enabled.

In this embodiment, since adhesion sheet 5 has such a structure that a part of the sheet melts by heating and tears by pressuring during flip chip bonding, bumps 4 are exposed from the torn adhesion sheet 5 upon flip chip bonding. Then the exposed bumps 4 can be electrically connected to electrodes 6a on a surface of organic substrate 6.

Such adhesion sheet 5 is adhered on the bumps-formed surface of the flip chip device by film adhesion layer 5a. Therefore, in contrast to the conventional example, steps of applying liquid thermosetting resin and solidifying the thermosetting resin thereafter by e. g. drying, are unnecessary. It is also unnecessary to coat with film- or sheet-shaped membrane in melted state by pressure flow, for example. Thus, the manufacturing steps can be simplified compared to that of conventional example.

In addition, adhesion sheet 5 torn at flip chip bonding is embedded between semiconductor chip 1 and organic substrate 6 after flip chip bonding, so it can eliminate the gaps therebetween.

Furthermore, since bumps 4 are covered with adhesion sheet 5 by adhering of adhesion sheet 5 prior to dicing process, the semiconductor device can be picked up without contacting bumps 4 after dicing. This prevents sticking of foreign matters on surfaces of bumps 4 and establishes good connectivity between bumps 4 and electrodes 6a.

Furthermore, high positional accuracy or high load is unnecessary upon adhering adhesion sheet 5 to the flip chip device, because the employed adhesion sheet 5 has such a structure that a part of the sheet melts by heating and tears by pressuring during flip chip bonding.

In addition, gaps A shown in FIG. 1 can be set to a vacuum state by adhering adhesion sheet 5 to semiconductor chip 1 in a vacuum chamber. This allows adhesion sheet 5 to adhere without gaps on the surface of semiconductor chip 1 after adhesion sheet 5 tears. It is therefore possible to embed without any gaps between semiconductor chip 1 and organic substrate 6 by adhesion sheet 5 after flip chip bonding.

Second Embodiment

As a rule, a dicing sheet is usually adhered on a surface opposite to bumps-formed surface of a semiconductor wafer before dicing. Herein, a dicing sheet is adhered to a semiconductor wafer before dicing and is drawn after dicing to widen a space between each semiconductor chip to make each semiconductor chip easier to take out.

Figure 4:
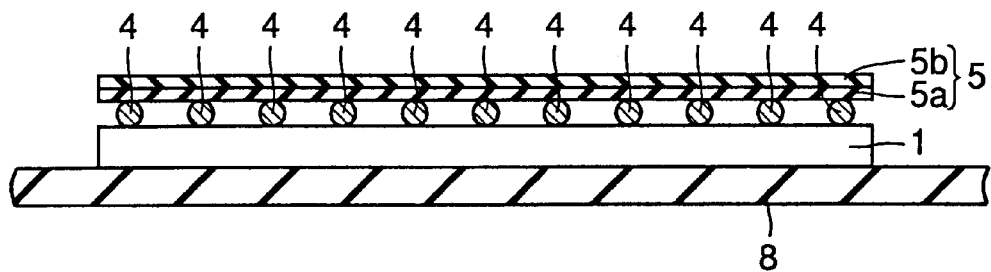
FIG. 4 is a schematic cross sectional view showing a structure of a semiconductor wafer with a dicing sheet adhered on its back surface.

Thus, in case of adhering a dicing sheet to a semiconductor wafer of the present invention by a conventional method, as shown in FIG. 4, a dicing sheet 8 is adhered on a surface opposite to bumps-formed surface of semiconductor wafer 1, and adhesion sheet 5 is adhered on the bumps-formed surface.

Figure 5:
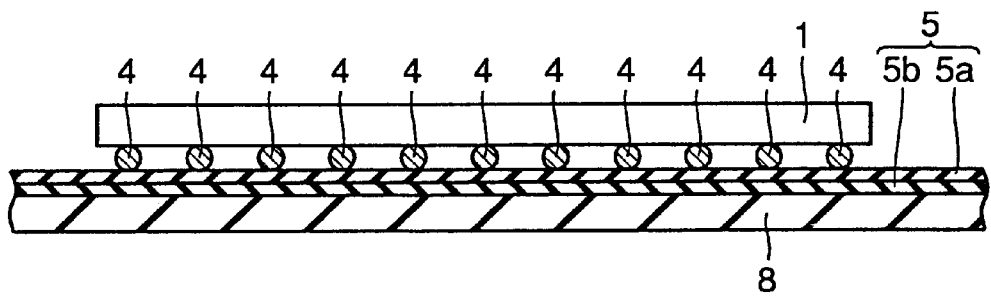
FIG. 5 is a schematic cross sectional view showing a structure of an integrated dicing sheet and adhesion sheet.

As shown in FIG. 5, however, adhesion sheet 5 integrated into dicing sheet 8 can also be adhered on bumps-formed surface of semiconductor chip 1. In this case, either the step of adhering adhesion sheet 5 to semiconductor wafer 1 or the step of adhering semiconductor wafer 1 to dicing sheet 8 can be eliminated, which can further simplify the manufacturing steps.

Third Embodiment

Figure 6:
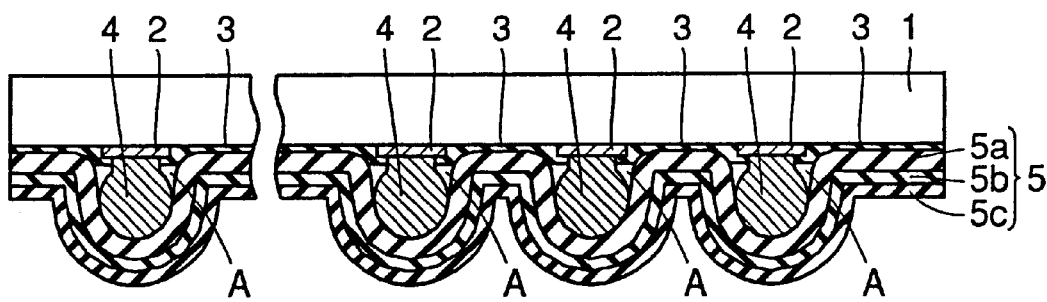
FIG. 6 is a schematic cross sectional view showing a structure of a semiconductor device in a third embodiment of the present invention.

Although adhesion sheet 5 whose structure consists of two layers of film adhesion layer 5a and film base material layer 5b is described in the first embodiment, adhesion sheet 5 may also have a three-layered structure as shown in FIG. 6, in which film base material layer 5b is sandwiched between film adhesion layers 5a and 5c. Other structures shown in FIG. 6 is similar to that shown in FIG. 1 with the same reference characters indicating the same members, so the description will not be repeated here.

Figure 7:
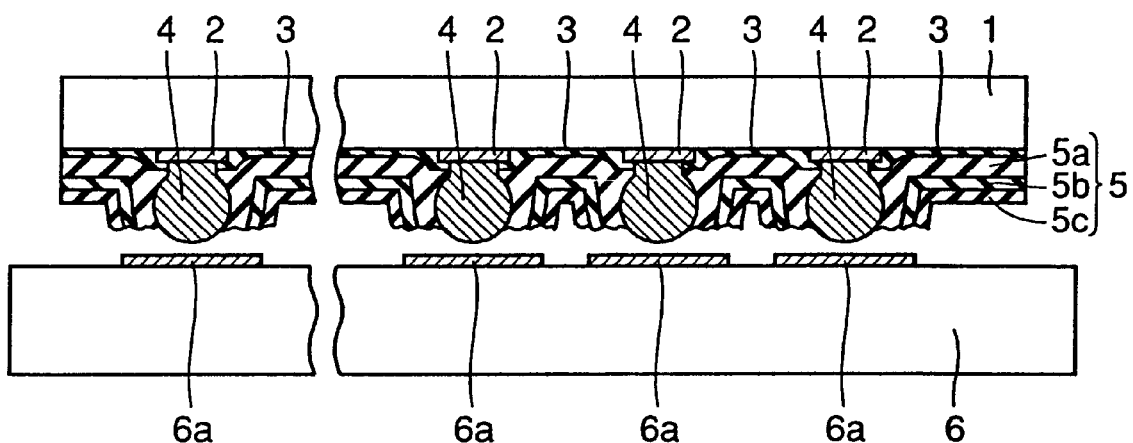
FIGS. 7 and 8 are schematic cross sectional views showing steps of method of manufacturing a semiconductor device (flip chip bonding method) in the third embodiment of the present invention.
Figure 8:
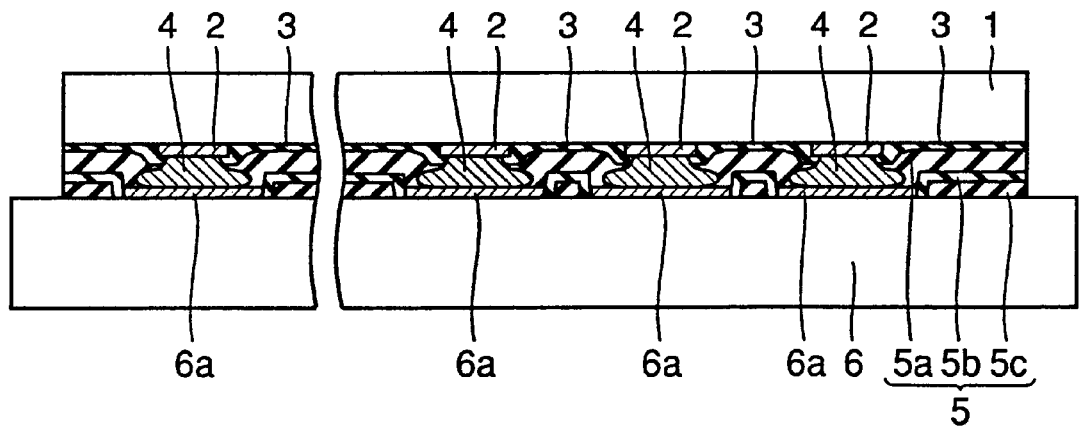

In the structure shown in FIG. 6 where adhesion sheet 5 of a three-layered structure is provided, a part of adhesion sheet 5 melts by heating and tears by pressuring during flip chip bonding, and parts of surfaces of bumps 4 are exposed from adhesion sheet 5, as shown in FIG. 7. Then bumps 4 can be electrically connected to electrodes 6a of organic substrate 6 by further pressuring, as shown in FIG. 8. In addition, as film adhesion layers 5c of adhesion sheet 5 is adhered on the surface of organic substrate 6, junctional strength of semiconductor chip 1 and organic substrate 6 can increase.

Fourth Embodiment

Figure 9:
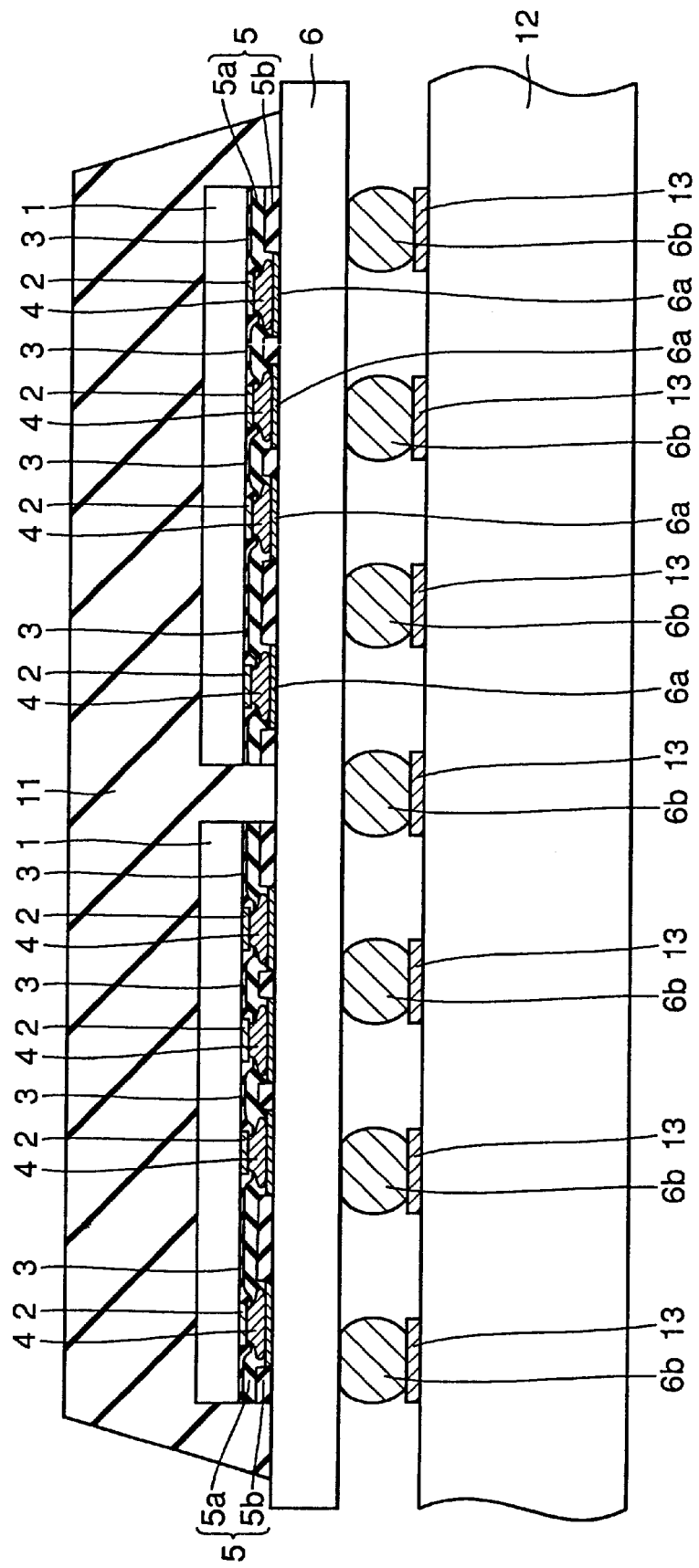
FIG. 9 is a schematic cross sectional view showing a structure of CSP or BGA as a structure of a semiconductor device of the present invention.
Figure 10:
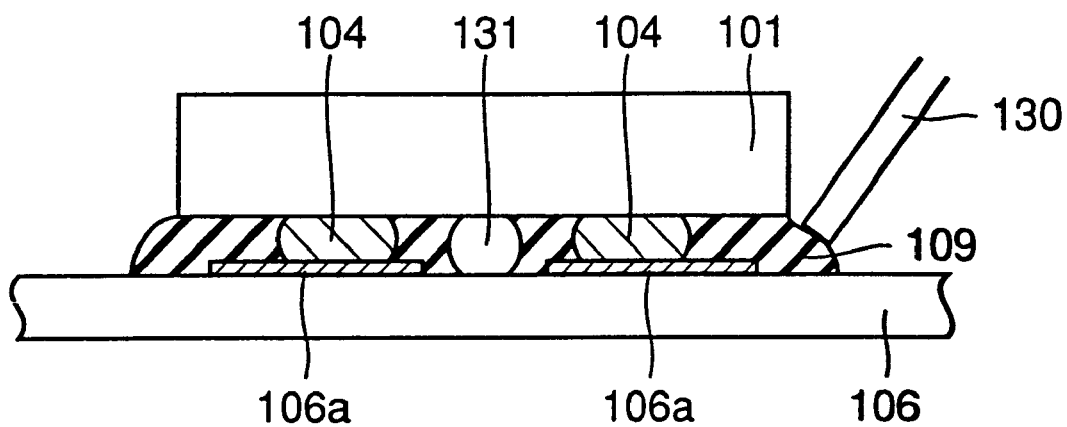
FIG. 10 is a schematic cross sectional view showing a prior example of filling an underfill material into gaps between a semiconductor chip and a substrate.
Figure 11:
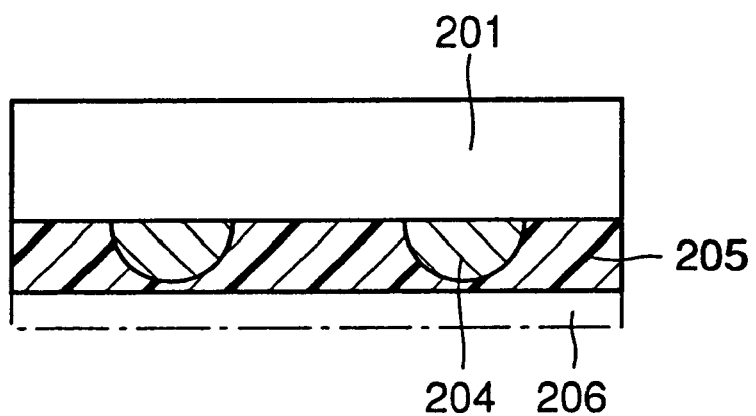
FIG. 11 is a schematic cross sectional view showing a structure of a semiconductor device disclosed in Japanese Patent Laying-Open No. 11-307586.

The structure obtained from flip chip bonding of the present invention can also be applied to CSP or BGA. FIG. 9 is a schematic cross sectional view showing a structure obtained when a semiconductor device obtained from flip chip bonding of the present invention is applied to CSP or BGA. Referring to FIG. 9, a plurality (for example, two) of semiconductor chips 1, whose structures are shown in FIGS. 1–3, are adhered on electrodes 6a of substrate 6, which semiconductor chips 1 are sealed with an insulator 11 such as resin to form CSP or BGA. Bumps 6b of CSP or BGA are electrically connected to electrodes 13 of organic substrate 12.

Although the example of bumps-formed semiconductor chip 1 used as flip chip device is described according to the first to fourth embodiments, it is not for limiting and any other device can also be used as long as it can be flip-chip-bonded.

In addition, while the example of solder used as a material of bumps 4 is described herein, the material is not limited to this and it can also include other materials such as gold (Au).

In addition, adhesion sheet 5 is not limited to its stacked structure of two or three layers, but it can consist of stacked structure of more than four layers, or it can be made of materials other than described in the embodiments above, as long as a part of the sheet melts by heating and tears by pressuring during flip chip bonding.

Further, while the example of a plurality of semiconductor chips 1 arranged on the single substrate are described in the fourth embodiment, only one semiconductor chip 1 may be adhered on substrate 6.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device, comprising;

adhering a sheet having a base material layer and an adhesion layer to a surface of a flip chip device including a bump, with said adhesion layer covering said bump;

flip-chip-bonding said flip chip device with said sheet adhered thereto to a substrate having an electrode by applying pressure and heating;

melting a part of said sheet by heating so that said sheet ruptures in response to pressure applied during said flip chip bonding, exposing said bump from said sheet, and electrically connecting said bump and said electrode to each other.

2. The method of manufacturing a semiconductor device according to claim 1, including adhering said sheet to said flip chip device in a vacuum chamber under vacuum.

3. The method of manufacturing a semiconductor device according to claim 1, further comprising forming said flip chip device by dicing a semiconductor wafer and adhering said sheet to said semiconductor wafer prior to dicing of said semiconductor wafer.

4. The method of manufacturing a semiconductor device according to claim 3, wherein said sheet is integrated into a dicing sheet.

* * * * *

UNITED STATES PATENT AND TRADEMARK OFFICE
CERTIFICATE OF CORRECTION

PATENT NO.    : 6,475,829 B2
DATED         : November 5, 2002
INVENTOR(S)   : Hatauchi et al.

It is certified that error appears in the above-identified patent and that said Letters Patent is hereby corrected as shown below:

<u>Title page, Item [54] and Column 1, lines 1 and 2,</u>
Change "SEMICONDUCTOR DEVICE AND MANUFACTURING METHOD THEREOF" to -- METHOD OF MANUFACTURING A SEMICONDUCTOR DEVICE --.

Signed and Sealed this

Twentieth Day of May, 2003

JAMES E. ROGAN
*Director of the United States Patent and Trademark Office*